United States Patent
Rhodes et al.

(10) Patent No.: US 7,919,828 B2
(45) Date of Patent: Apr. 5, 2011

(54) IMAGE SENSOR FOR REDUCED DARK CURRENT

(75) Inventors: Howard E. Rhodes, Boise, ID (US); Steve Cole, Boise, ID (US)

(73) Assignee: Aptina Imaging Corporation, George Town (KY)

( * ) Notice: Subject to any disclaimer, the term of this patent is extended or adjusted under 35 U.S.C. 154(b) by 123 days.

(21) Appl. No.: 11/580,012

(22) Filed: Oct. 13, 2006

(65) Prior Publication Data

US 2007/0029637 A1     Feb. 8, 2007

Related U.S. Application Data

(62) Division of application No. 10/740,599, filed on Dec. 22, 2003, now Pat. No. 7,205,584.

(51) Int. Cl.
   *H01L 29/00* (2006.01)
(52) U.S. Cl. ............. 257/506; 257/510; 257/72; 257/59
(58) Field of Classification Search ............... 257/292, 257/59, 72, 291, 369, 506, 510
   See application file for complete search history.

(56) References Cited

U.S. PATENT DOCUMENTS

| | | | | |
|---|---|---|---|---|
| 5,614,734 | A | * | 3/1997 | Guido ............................. 257/94 |
| 5,801,373 | A | * | 9/1998 | Oozu et al. ................. 250/208.1 |
| 5,936,270 | A | * | 8/1999 | Kamada ........................ 257/291 |
| 6,369,413 | B1 | | 4/2002 | Hynecek |
| 6,380,572 | B1 | * | 4/2002 | Pain et al. ..................... 257/292 |
| 6,403,998 | B1 | * | 6/2002 | Inoue ............................ 257/292 |
| 6,448,596 | B1 | * | 9/2002 | Kawajiri et al. ............. 257/292 |
| 6,525,394 | B1 | | 2/2003 | Kuhn et al. |
| 7,110,028 | B1 | * | 9/2006 | Merrill ........................ 348/294 |
| 2004/0201732 | A1 | * | 10/2004 | Kasuga et al. ............. 348/230.1 |

* cited by examiner

*Primary Examiner* — Wai-Sing Louie
*Assistant Examiner* — Bilkis Jahan

(57) ABSTRACT

A method and structure for reducing dark current in an image sensor includes preventing unwanted electrons from being collected in the photosensitive region of the image sensor. In one embodiment, dark current is reduced by providing a deep n-type region having an n-type peripheral sidewall formed in a p-type substrate region underlying a pixel array region to separate the pixel array region from a peripheral circuitry region of the image sensor. The method and structure also provide improved protection from blooming.

3 Claims, 18 Drawing Sheets

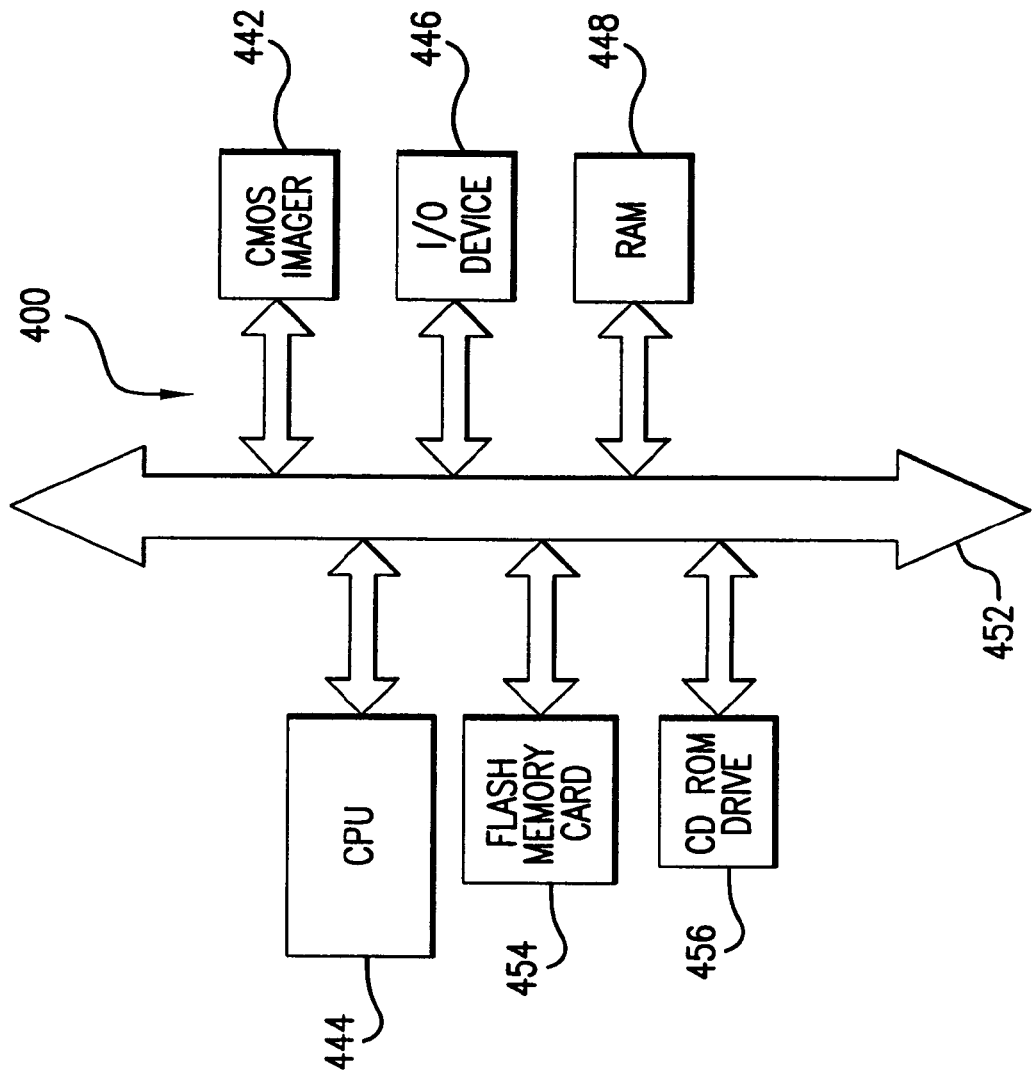

IMAGE SENSOR FOR REDUCED DARK CURRENT

CROSS REFERENCE TO RELATED APPLICATIONS

The present application is a divisional of U.S. patent application Ser. No. 10/740,599 filed on Dec. 22, 2003, now U.S. Pat. No. 7,205,584 the disclosure of which is incorporated by reference in its entirety.

FIELD OF THE INVENTION

The invention relates to improved semiconductor imaging devices and, in particular, to CMOS image sensors having reduced dark current.

BACKGROUND OF THE INVENTION

In silicon integrated circuit (IC) fabrication, it is often necessary to isolate devices that are formed in a single substrate from one another. The individual devices or circuit components subsequently are connected to other circuit elements to create a specific circuit configuration.

A CMOS image sensor circuit includes a focal plane array of pixels, each one of the pixels includes a photo-conversion device, e.g., a photogate, photoconductor, or photodiode having an associated charge accumulation region within a substrate for accumulating photo-generated charge. Each pixel may include a transistor for transferring charge from the charge accumulation region to a diffusion node and a transistor for resetting the diffusion node to a predetermined charge level prior to charge transference. The pixel may also include a source follower transistor for receiving and amplifying charge from the diffusion node and an access transistor for controlling the readout of the pixel contents from the source follower transistor. In some arrangements, the transfer transistor is omitted and the charge accumulation region is coupled with the diffusion node.

In a CMOS image sensor, the active elements of a pixel perform the necessary functions of: (1) photon to charge conversion; (2) accumulation of image charge; (3) transfer of charge to the diffusion node accompanied by charge amplification where a transfer transistor is used; (4) resetting the diffusion node to a known state before the transfer of charge to it; (5) selection of a pixel for readout; and (6) output and amplification of a reset signal and a signal representing pixel charge from the diffusion node. The charge at the floating diffusion node is typically converted to a pixel output voltage by the source follower output transistor.

CMOS image sensors of the type discussed above are generally known as discussed, for example, in Nixon et al., "256×256 CMOS Active Pixel Sensor Camera-on-a-Chip," IEEE Journal of Solid-State Circuits, Vol. 31(12), pp. 2046-2050 (1996); and Mendis et al., "CMOS Active Pixel Image Sensors," IEEE Transactions on Electron Devices, Vol.41(3), pp. 452-453 (1994). See also U.S. Pat. Nos. 6,177,333 and 6,204,524 which describe operation of conventional CMOS image sensors, the contents of which are incorporated herein by reference.

Reducing dark current in a photodiode is important in CMOS image sensor fabrication which use photodiodes as the photoconversion device. One source of dark current is leakage in the charge collection region of a photodiode, which is strongly dependent on the doping implantation conditions. Other sources of dark current include unwanted electrons from peripheral circuits and electron generation from infrared photons. Dark current is also caused by current generated from trap sites inside or near the photodiode depletion region; band-to-band tunneling induced carrier generation as a result of high fields in the depletion region; junction leakage coming from the lateral sidewall of the photodiode; and leakage from isolation corners, for example, stress induced and trap assisted tunneling.

Another problem often associated with photodiodes is that of blooming. That is, under illumination, electrons can fill up an n-type well. Under saturation light conditions, the n-type well can completely fill with electrons, and the electrons will then bloom to adjacent pixels. Blooming is undesirable because it can lead to, for example, the presence of a bright spot on the image.

BRIEF SUMMARY OF THE INVENTION

The invention provides a method and structure for reducing dark current in an image sensor by preventing unwanted electrons from being collected in the photosensitive regions of the pixels. The invention also provides a method and structure for improved protection from blooming.

In one aspect of the invention, dark current is reduced by providing a deep n-type region having an n-type peripheral sidewall formed in a p-type substrate region underlying a pixel array region to separate the pixel array region from a peripheral circuitry region of the image sensor.

The deep n-type region also provides improved blooming protection by acting as a vertical overflow drain. The deep n-type region creates a region of lower potential within which the electrons can collect, which lessens the possibility of blooming.

In another aspect, the invention provides an image sensor formed using a p-type epitaxial or implanted layer on an n-type wafer having a deep peripheral n-type sidewall formed to separate a pixel array region from a peripheral circuitry region of the image sensor.

In another aspect, the invention provides a method of fabricating a deep n-type region beneath a pixel array region, the deep n-type region having an n-type peripheral sidewall formed in a p-type substrate region.

These and other features of the invention will be apparent from the following detailed description and drawings which illustrate preferred embodiments of the invention.

BRIEF DESCRIPTION OF THE DRAWINGS

FIG. 10 is a schematic diagram of a processor system incorporating a CMOS image sensor constructed in accordance with the invention.

DETAILED DESCRIPTION OF THE INVENTION

In the following detailed description, reference is made to the accompanying drawings, which form a part hereof, and in which is shown by way of illustration of specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the invention.

The terms "wafer" and "substrate" are to be understood as including silicon, silicon-on-insulator (SOI), or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on other semiconductors including silicon-germanium, germanium, or gallium-arsenide.

The term "pixel" refers to a picture element unit cell containing a photosensor and transistors for converting electromagnetic radiation to an electrical signal. For purposes of illustration, a representative pixel is illustrated in the figures and description herein, and typically fabrication of all pixels in an image sensor will proceed simultaneously in a similar fashion.

Embodiments of the invention provide structures and methods to reduce unwanted dark current and/or reduce blooming in CMOS image sensors, as described below with reference to FIGS. 1-15. In one embodiment, the invention provides a deep n-type region having a peripheral n-type sidewall formed in a p-type substrate to separate a pixel array region from a peripheral circuit region of the CMOS image sensor, and a method of fabrication therefor.

In another aspect, the invention provides a CMOS image sensor formed using a p-type epitaxial or implanted layer on an n-type wafer having a deep peripheral n-type sidewall formed to separate an image sensor pixel array region from a peripheral circuit region of the sensor, and a method of fabrication therefor.

The invention reduces undesired effects, such as dark current generation from peripheral circuits and electron generation from infrared (IR) photons.

Figure 11A:
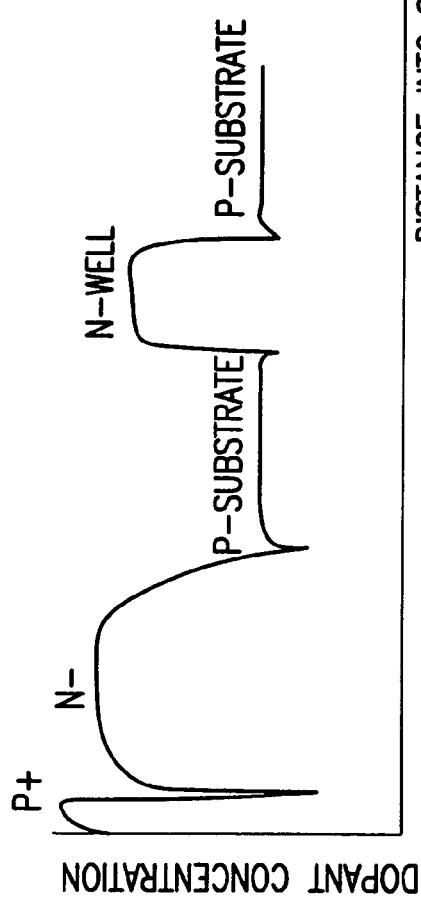
FIG. 11A is a plot of dopant concentration versus distance into a silicon layer for a photodiode.
Figure 11B:
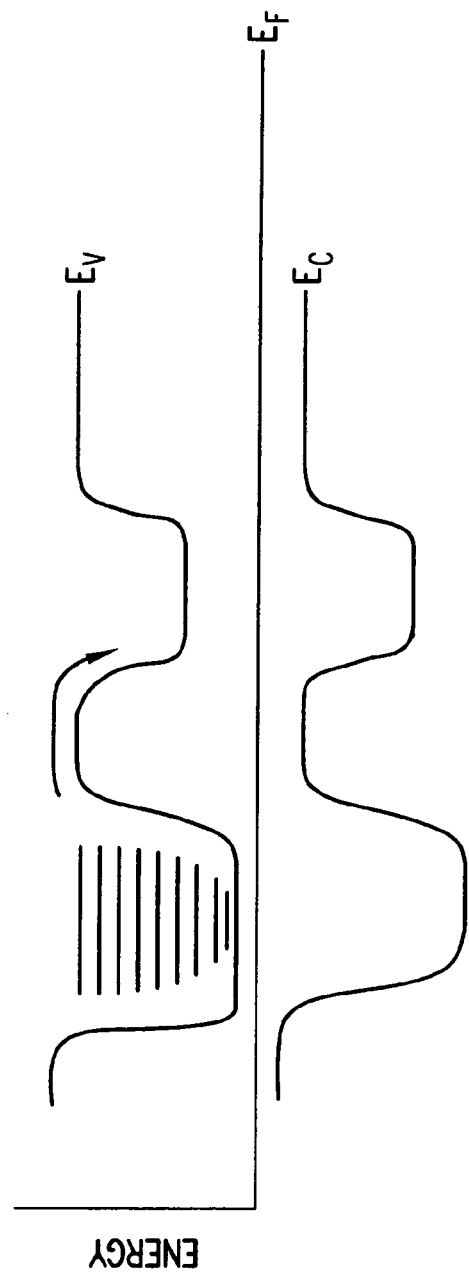
FIG. 11B is an energy band diagram for a vertical overflow drain.

FIG. 11A is a plot of dopant concentration versus distance into a silicon layer for a photodiode according to exemplary embodiments of the invention. FIG. 11B is an energy band diagram for a vertical overflow drain according to exemplary embodiments of the invention. As depicted in FIGS. 11A and 11B, the deep n-type region also provides improved blooming protection by acting as a vertical overflow drain. The deep n-type region creates a region of lower potential within which the electrons can collect, which lessens blooming.

Figure 1A:
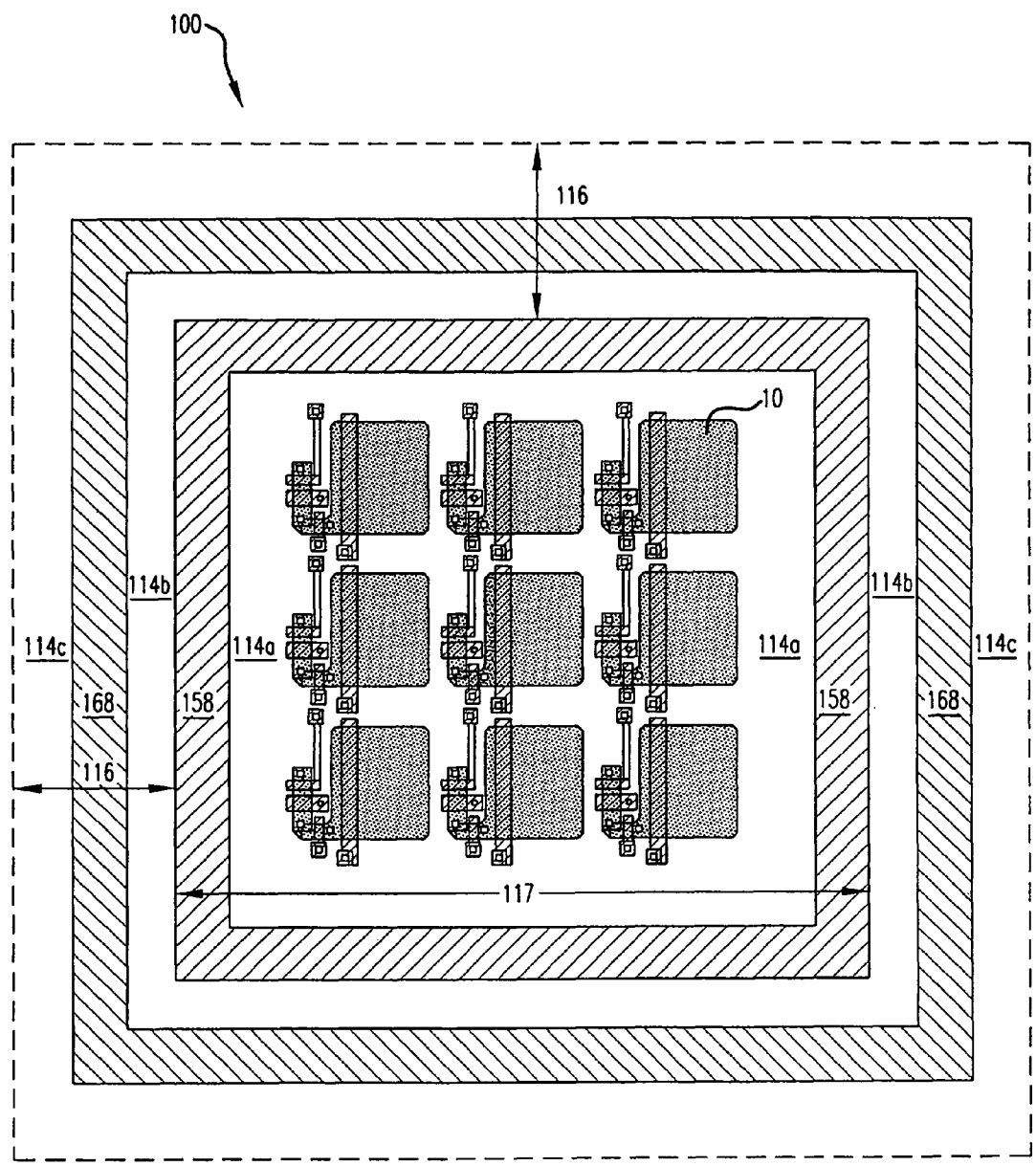
FIG. 1A is a top down view of a CMOS image sensor fragment in accordance with the invention.

Referring now to FIG. 1A, which illustrates a top view of a CMOS image sensor indicated generally by reference numeral 100. Image sensor 100 comprises a peripheral substrate region 116 and a pixel array substrate region 117. Field oxide regions 114 are used to isolate individual pixels 10 as well as to isolate circuits in the peripheral substrate region 116 from the pixel array substrate region 117. For clarification in describing the invention, the field oxide regions are segmented as 114a, 114b, and 114c; however, the field oxide regions will generally be described as 114.

Figure 1B:
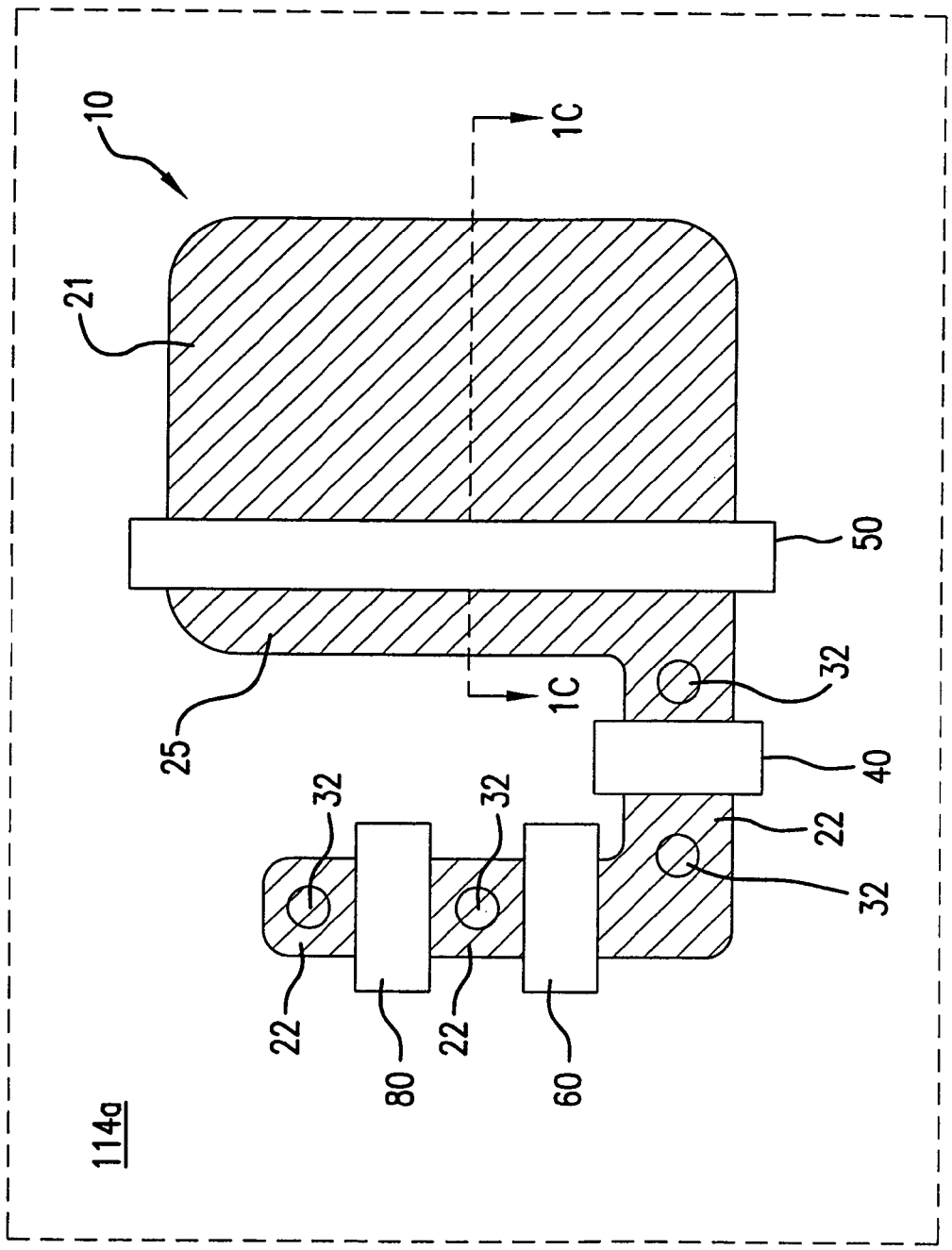
FIG. 1B is a top down view of an individual pixel of the CMOS image sensor of FIG. 1A.

Referring now to FIG. 1B an individual four-transistor (4T) pixel pixel 10 of an exemplary CMOS image sensor 100 is shown enlarged. The CMOS image sensor pixel 10 generally comprises a transfer gate 50 for transferring photoelectric charges generated in a pinned photodiode 21 to a diffusion region 25 acting as a sensing node, which is in turn, electrically connected to the gate 60 of an output source follower transistor. A reset gate 40 is provided for resetting the sensing node 25 to a predetermined voltage in order to sense a next signal, and a row select gate 80 is provided for outputting a signal from the source follower transistor to an output terminal in response to a pixel row select signal.

Figure 1C:
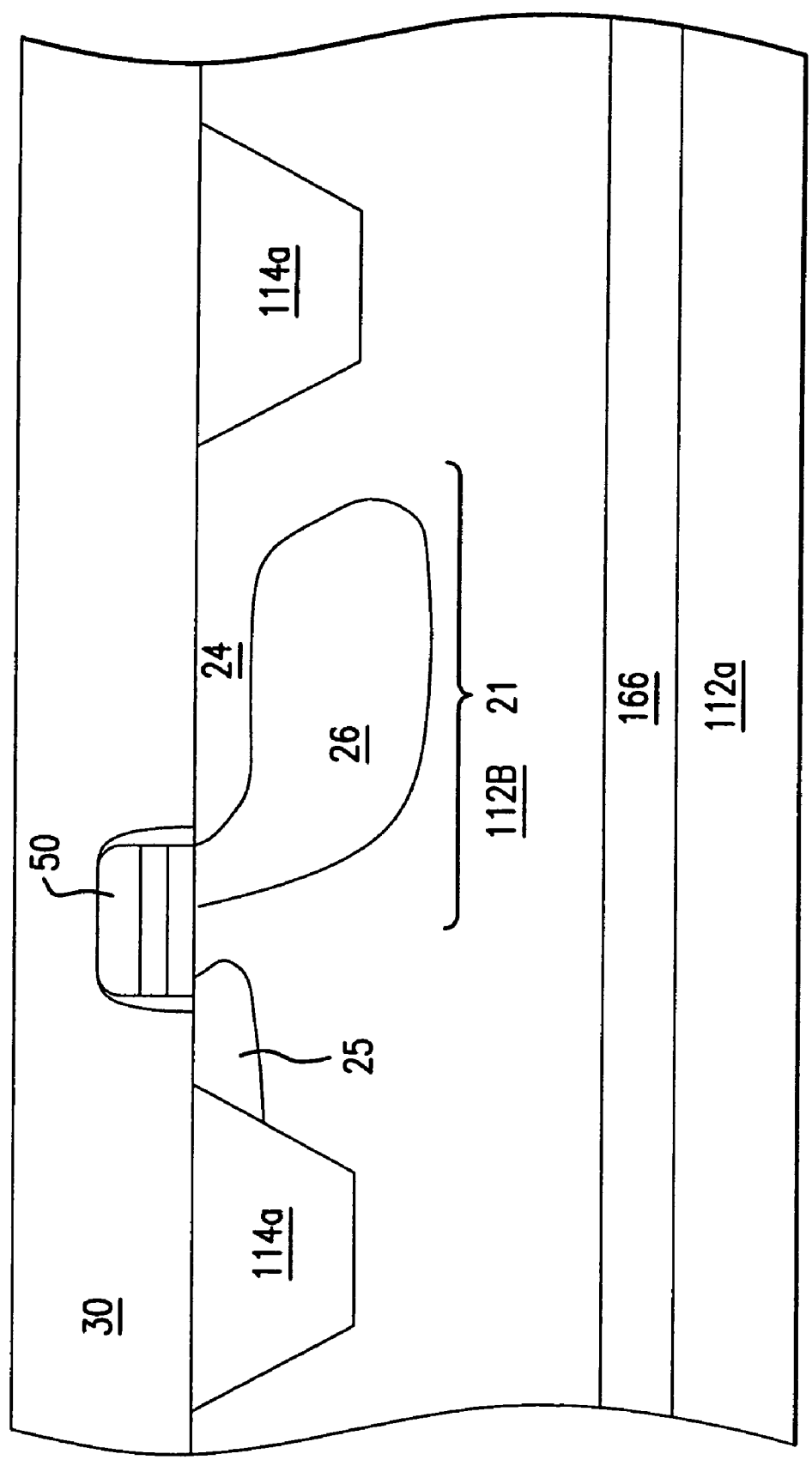
FIG. 1C is a fragmentary sectional view of a section of the pixel of FIG. 1B fragment in accordance with the invention.

A view of a section of the individual pixel taken along line 1C-1C of FIG. 1B is shown in FIG. 1C. A pinned photodiode 21 has a photosensitive p-n junction region comprising a p-type surface layer 24 and an n-type photodiode region 26. The n-type photodiode region 26 is provided within a p-type substrate 112. The pinned photodiode is termed such since the potential in the photodiode is pinned to a constant value when the photodiode is fully depleted. The p-type substrate 112 may be formed as a continuous p-type doped substrate or as a p-type well formed in a silicon substrate, or as a p-type epitaxial layer of a substrate. A deep n-type region 166 is formed in the p-type substrate 112, such that at least in the pixel array substrate region 117, the deep n-type region 166 is sandwiched between a first p-type substrate area 112a below n-type region 166 and a second p-type substrate area 112b above n-type region 166. Impurity doped source/drain regions 22, preferably having n-type conductivity, are provided on either side of the gates 40, 60, 80 (as shown in FIG. 1B). The floating diffusion region 25 adjacent to the transfer gate 50, is also preferably n-type.

Conventional field oxide regions 114 often referred to as trench isolation regions are formed in the p-type substrate 112. The field oxide regions 114 are formed using a conventional STI process and are typically formed by etching a trench in the substrate 112 via a directional etching process, such as Reactive Ion Etching (RIE), or etching with a preferential anisotropic etchant used to etch into the substrate 112.

The trenches are then filled with an insulating material, for example, silicon dioxide, silicon nitride, ON (oxide-nitride), NO (nitride-oxide), or ONO (oxide-nitride-oxide). The insulating materials may be formed by various chemical vapor deposition (CVD) techniques such as low pressure chemical vapor deposition (LPCVD), high density plasma (HDP) deposition, or any other suitable method for depositing an insulating material within a trench. After the trenches are filled with an insulating material, a planarizing process such as chemical mechanical polishing is used to planarize the structure.

The gates 40, 50, 60, and 80 are typically formed after the STI trench is formed and filled. The gates are formed by blanket deposition of the material layers of the gates which are etched to form the gates 40, 50, 60, 80. An insulator is then deposited and etched to form sidewall spacers of the gates 40, 50, 60, 80. The order of these preliminary process steps may be varied as is required or convenient for a particular process flow.

After the gate stacks are formed, and before or after the sidewall spacers are applied, the substrate is doped to form source and drain regions on opposite sides of the gates, one of which is specially implanted to form the n-type region 26 of photodiode 21. In a preferred embodiment, the n-type region 26 is formed before the sidewall spacers are formed. A translucent or transparent insulating layer 30 is next formed over the CMOS image sensor. This insulating layer 30 is typically $SiO_2$, BPSG, PSG, BSG, or SOG which is planarized. Conventional processing methods are then carried out to form, for example, contacts 32 (shown in FIG. 1A) in the insulating layer 30 to provide an electrical connection to the source/drain regions 22, the floating diffusion region 25, and other wiring to connect to the gates of the pixel 10.

Figure 1D:
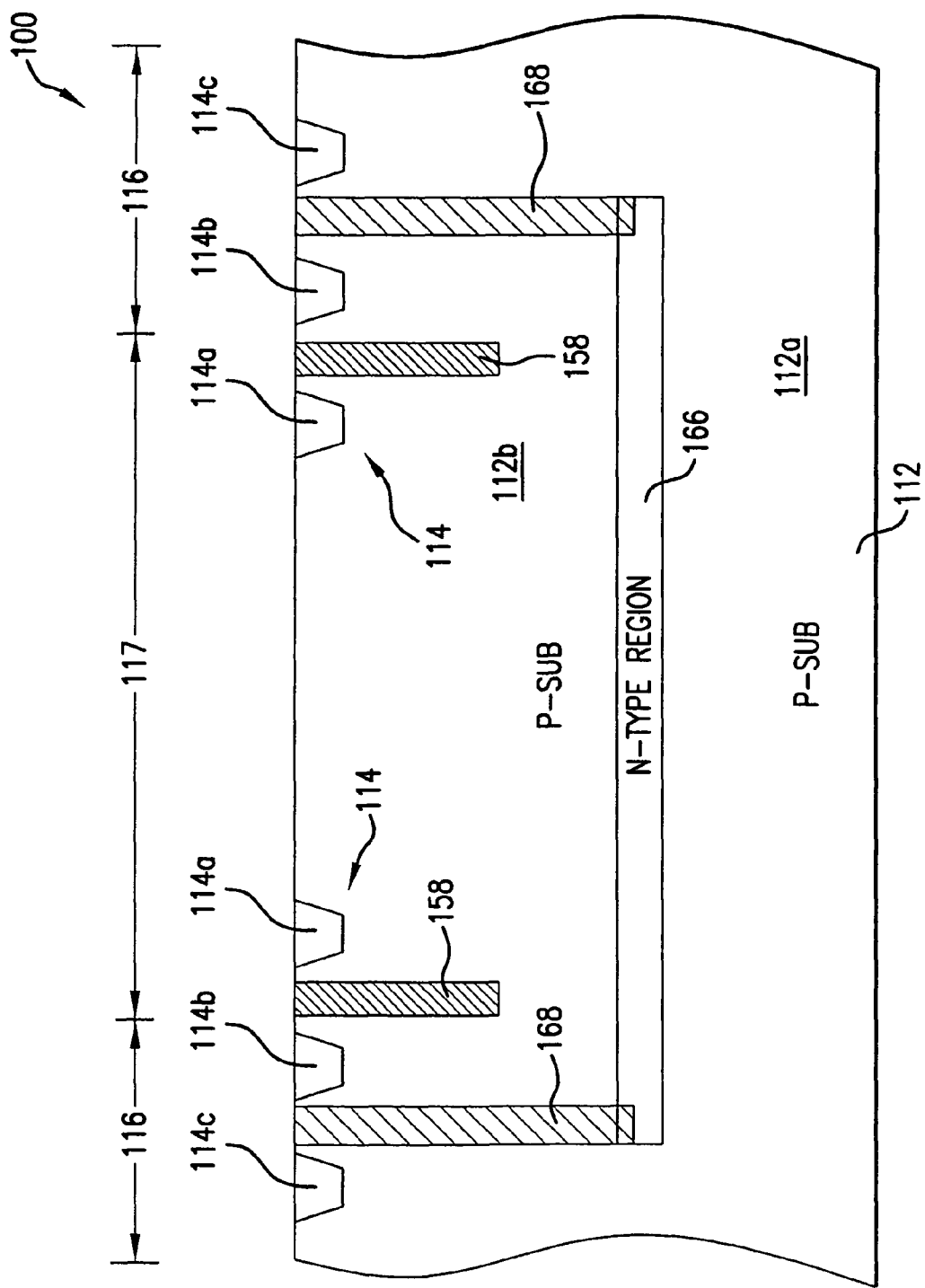
FIG. 1D is a fragmentary sectional view of the CMOS image sensor fragment of FIG. 1A in accordance with the invention.

Referring now back to FIG. 1A and to FIG. 1D, a deep n-type region 166 having an n-type peripheral sidewall 168 is formed in the p-type substrate 112, such that at least in the pixel array substrate region 117, the deep n-type region 166 is sandwiched between a first p-type substrate area 112*a* below n-type region 166 and a second p-type substrate area 112*b* above n-type region 166. The n-type region 166 preferably extends under the pixel array substrate region 117 and below the field oxide regions 114 which surround the pixel array substrate region 117. The n-type sidewall 168 is preferably a contiguous structure. The n-type sidewall 168 surrounds the pixel array substrate region 117 and extends downwardly to the n-type region 166. The n-type sidewall 168 further isolates the first p-type substrate area 112*a* from the second p-type substrate area 112*b*. It should be noted that although the n-type sidewall 168 can be, in one embodiment, a contiguous structure, it is not necessarily annular. The n-type sidewall 168 provides an electrical connection to the n-type region 166.

The pixel array substrate region 117 further includes p-well implants in the form of a peripheral p-well sidewall or wall 158 formed around the perimeter of the pixel array substrate region 117 and inward to the n-type sidewall 168. It is also possible for the p-well implants to instead, or also, surround each repeating pixel. Hereinafter, the p-well implants will be referred to as a p-well wall so as not to be confused with the n-type region sidewall 168, but it should be understood that the p-well implant may be referred to as a sidewall or wall. In one embodiment, the p-well wall 158 can be contiguous. In another possible embodiment, the p-well wall 158 can be non-contiguous. In the non-contiguous embodiment, the p-well wall 158 includes a plurality of discrete, non-contiguous regions, i.e., the p-well wall 158 includes a plurality of local p-well implants, each of which has a contact to connect the p-substrate to a given potential. The p-well wall 158 extends below the field oxide regions 114 and within the second p-type substrate area 112*b* so as to provide an electrical connection to the p-type substrate area 112*b*. Although one p-well wall is shown, the invention is not limited to one p-well wall and a CMOS image sensor in accordance with the invention may include one or more p-well walls 158. The p-well wall 158 is preferably formed in the field oxide region 114 near the outer edges of the pixel array substrate region 117.

Figure 12:
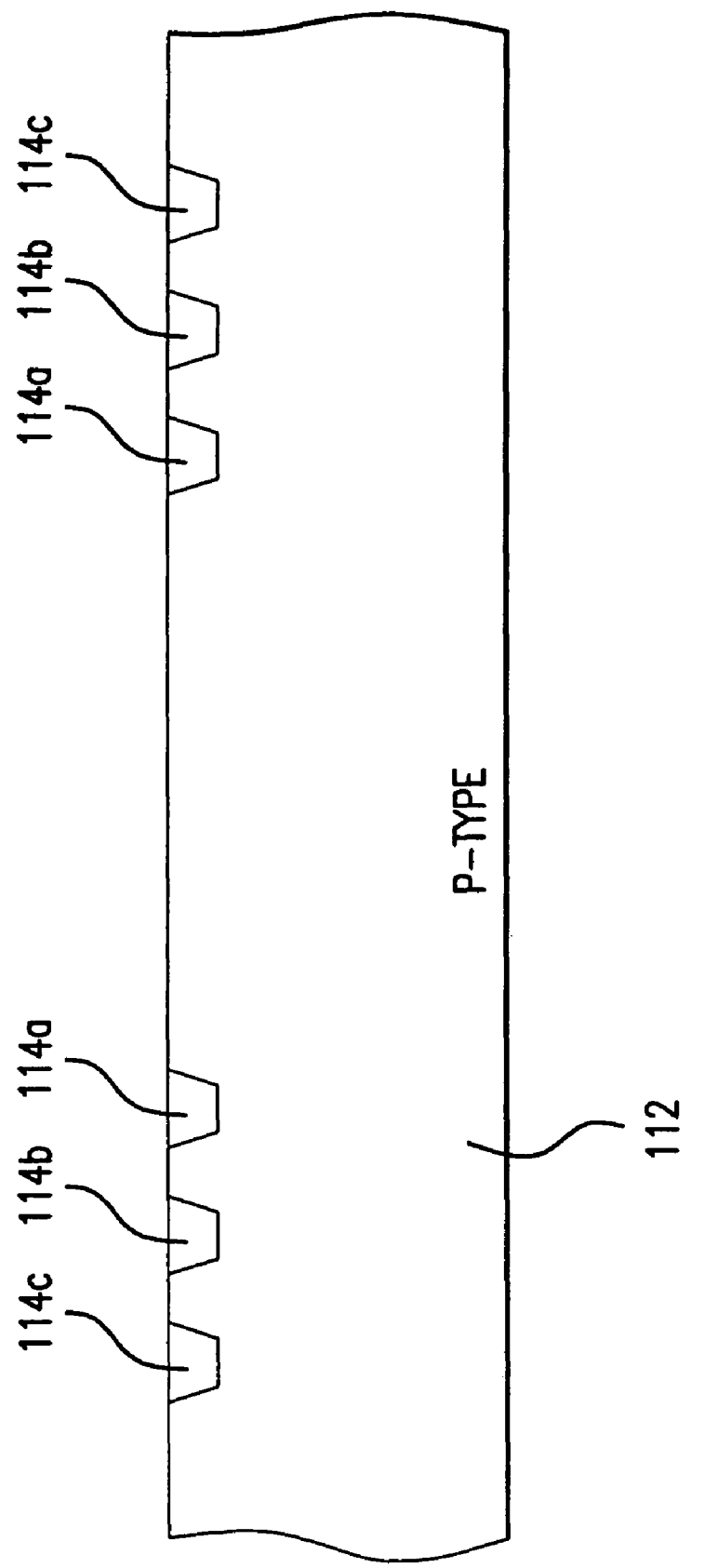
FIG. 12 is a view of the FIG. 1A sensor fragment at one processing step in accordance with a preferred embodiment of the invention.
Figure 13:
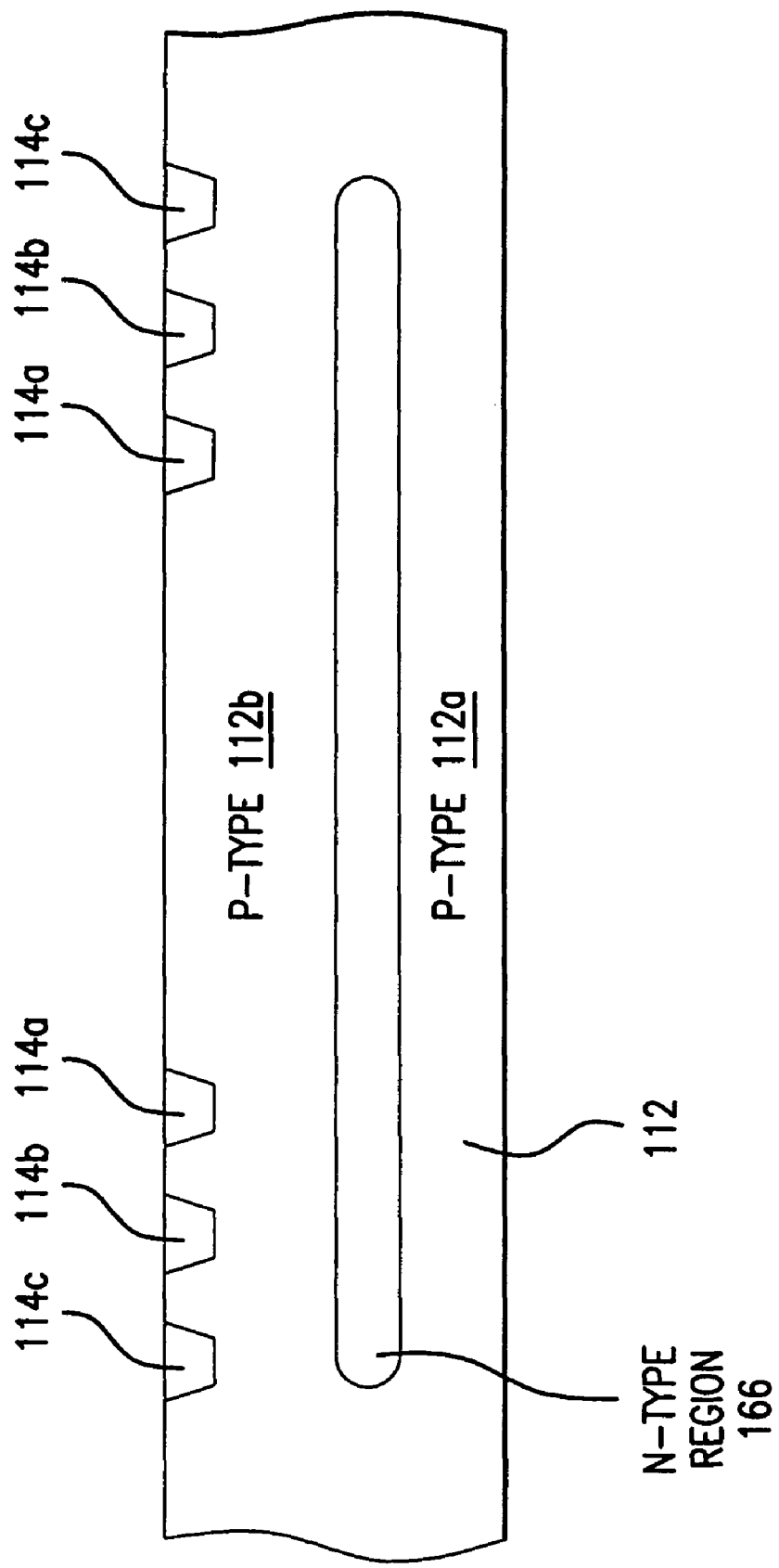
FIG. 13 is a view of the FIG. 1A sensor fragment at one processing step subsequent to that shown in FIG. 12.
Figure 14:
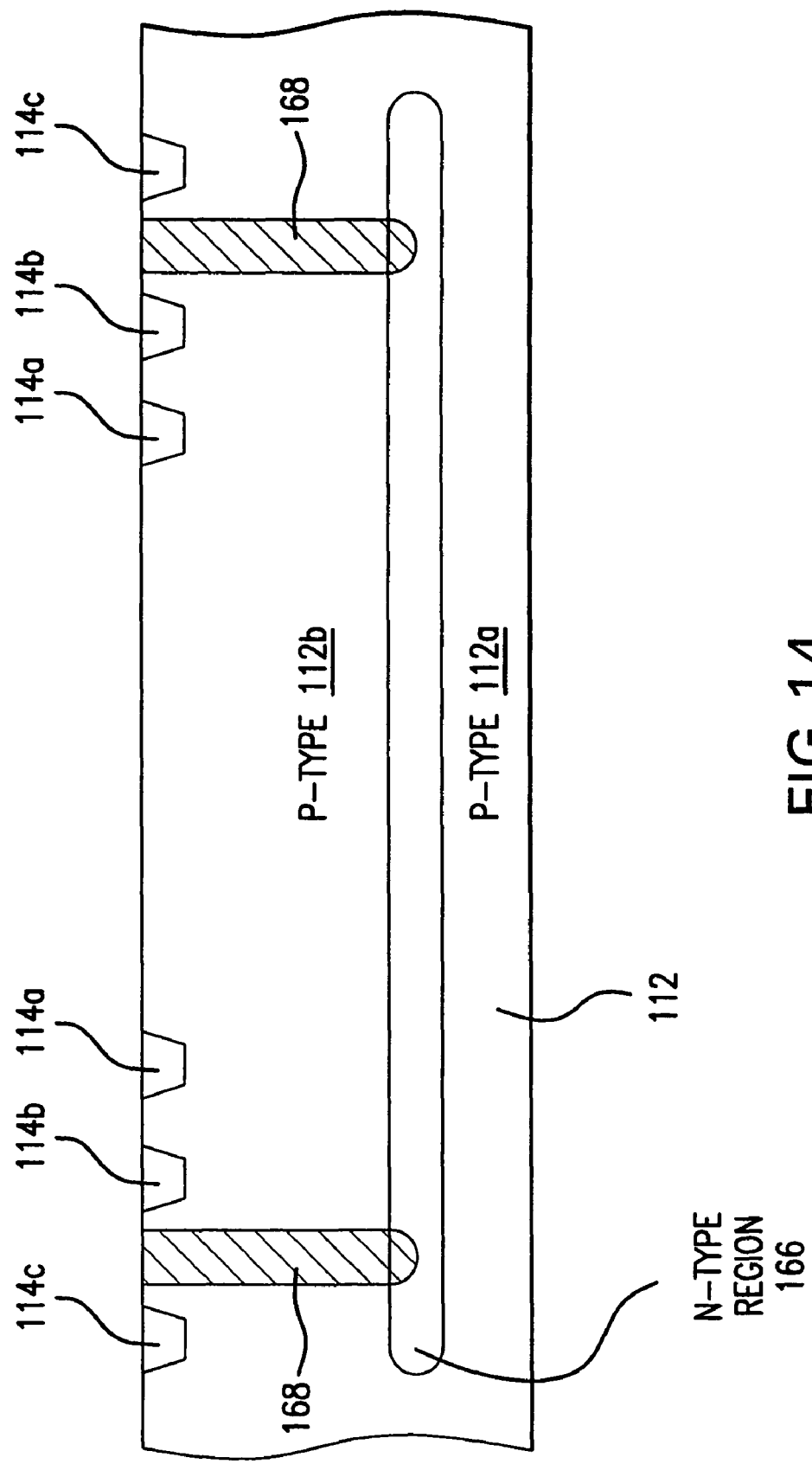
FIG. 14 is a view of the FIG. 1A sensor fragment at one processing step subsequent to that shown in FIG. 13.
Figure 15:
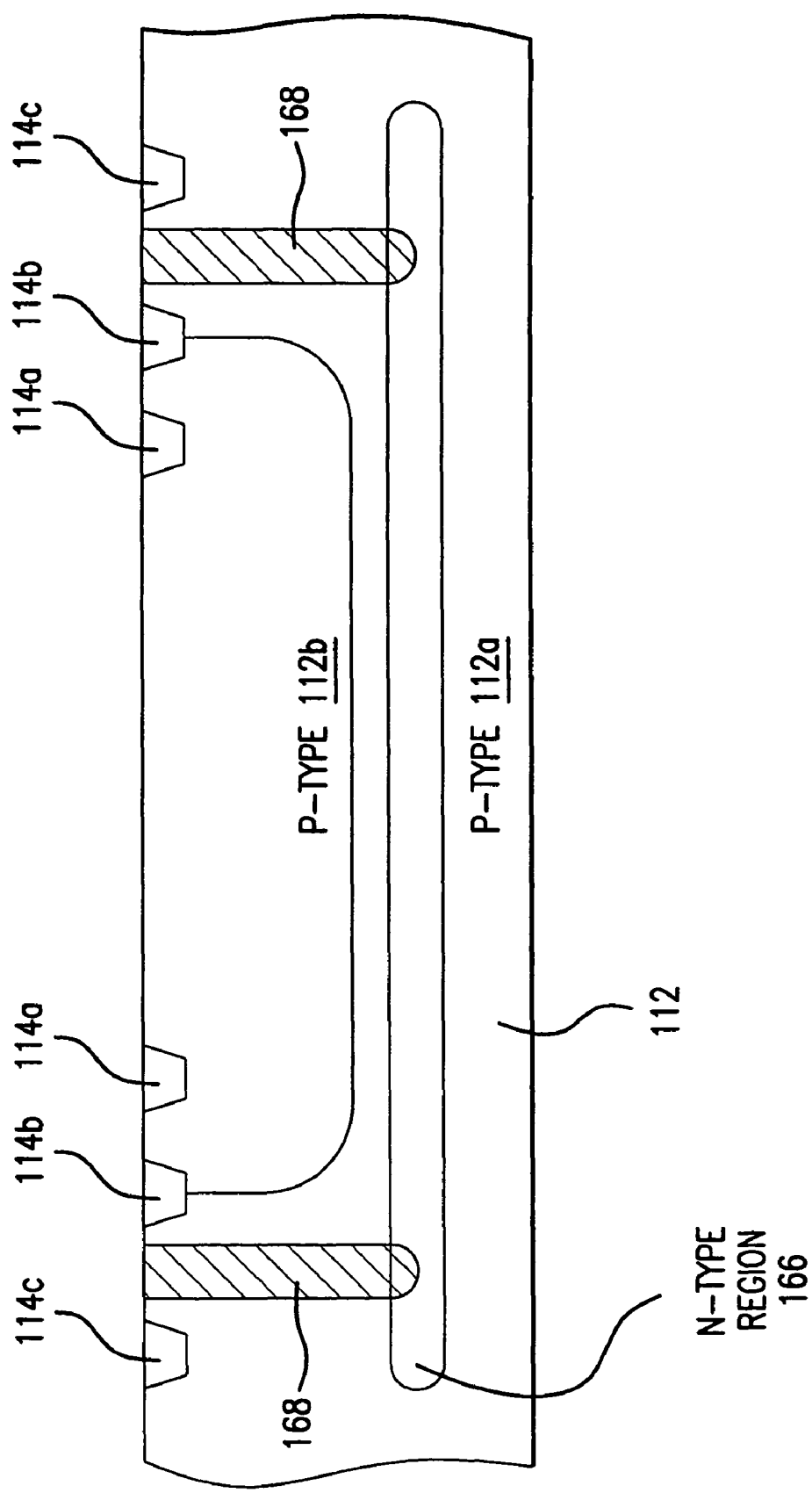
FIG. 15 is a view of the FIG. 1A sensor fragment at one processing step subsequent to that shown in FIG. 14.

The CMOS image sensor in accordance with the first embodiment may be fabricated using several fabrication processes. In a preferred embodiment of the fabrication process, depicted in FIGS. 12-15, the field oxide regions 114 are formed first, i.e., before the n-type region 166, and n-type sidewall 168 are formed. Referring now to FIG. 12, a first conductivity type implant, for example p-type, is provided into a substrate 112. Next, field oxide regions 114*a*, 114*b*, and 114*c* are formed in substrate 112. Referring now to FIG. 13, a deep n-type region 166 is formed in substrate 112 above p-type substrate area 112*a* and below p-type substrate area 112*b*. Next, as depicted in FIG. 14, an n-type sidewall 168 is formed. The n-type sidewall 168 and n-type region 166 form an n-type region isolation structure which separates the pixel array region 117 from the peripheral circuit region 116. Referring now to FIG. 15, one or more p-well implants are performed into second p-type substrate area 112*b*, so that n-type region 166 is preferably sandwiched between the first p-type substrate area 112*a* and one or more p-wells in the second p-type substrate area 112*b*.

In a variation of the above-described preferred embodiment of the fabrication process, there can be multiple p-well regions in p-type substrate area 112*b* in pixel array region 117. Furthermore, the order of the implantation steps depicted in FIGS. 13, 14, and 15 can be varied. That is, for example, p-substrate area 112*b* can be formed before n-type sidewall 168, or n-type sidewall 168 can be formed before n-type region 166.

Figure 2:
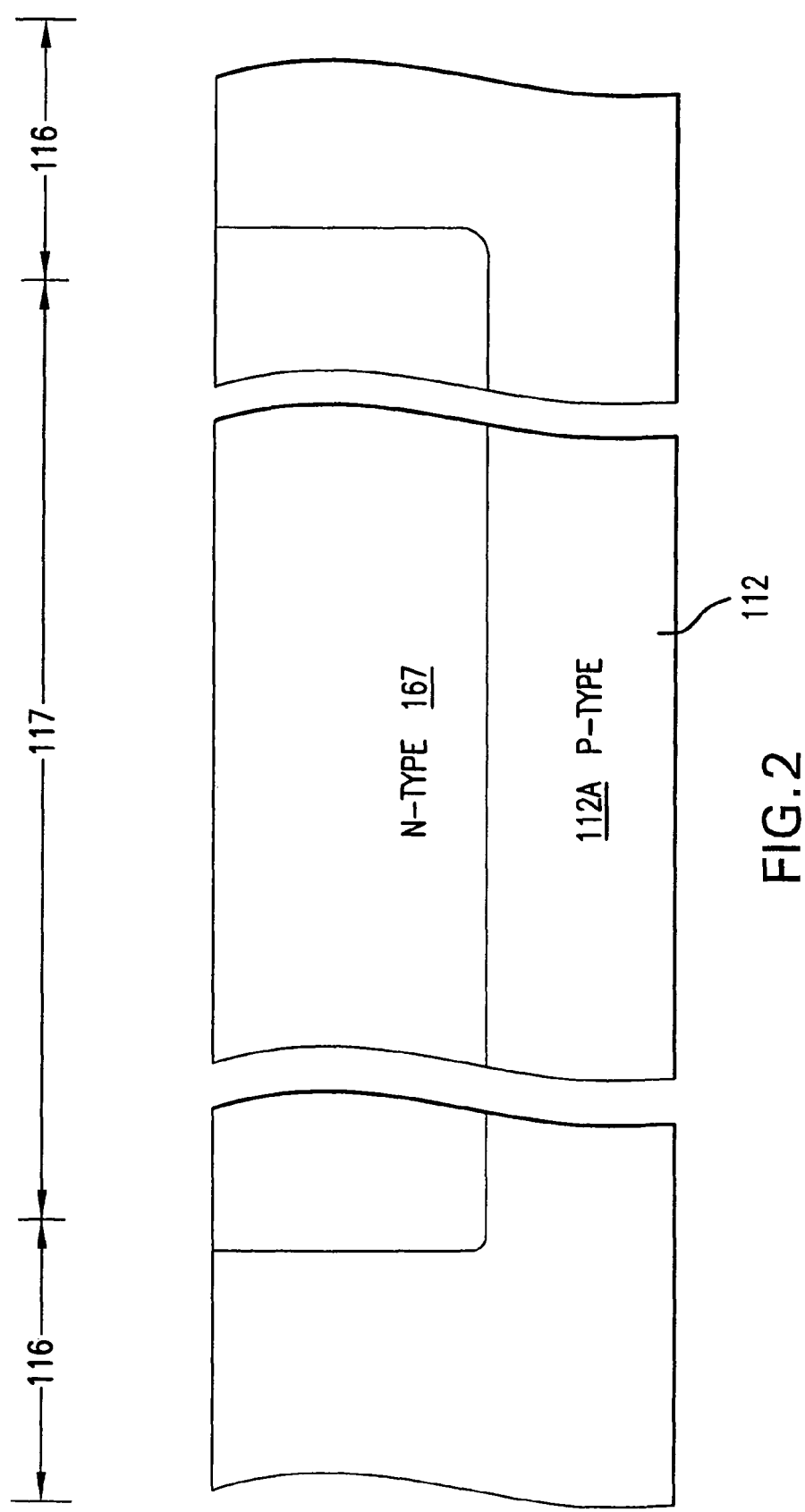
FIG. 2 is a view of the FIG. 1A sensor fragment at one processing step in accordance with the invention.

An alternative embodiment of the fabrication process is described in connection with FIGS. 2 through 5. Referring now to FIG. 2, a first conductivity type implant, for example p-type, is provided into a substrate 112 to form a first p-type substrate area 112*a*. A second conductivity type implant, for example n-type, is provided into the substrate to form a second conductivity type well 167. The n-type well 167 preferably extends at least through out the pixel array substrate region 117 and preferably may extend into the peripheral substrate region 116.

Figure 3:
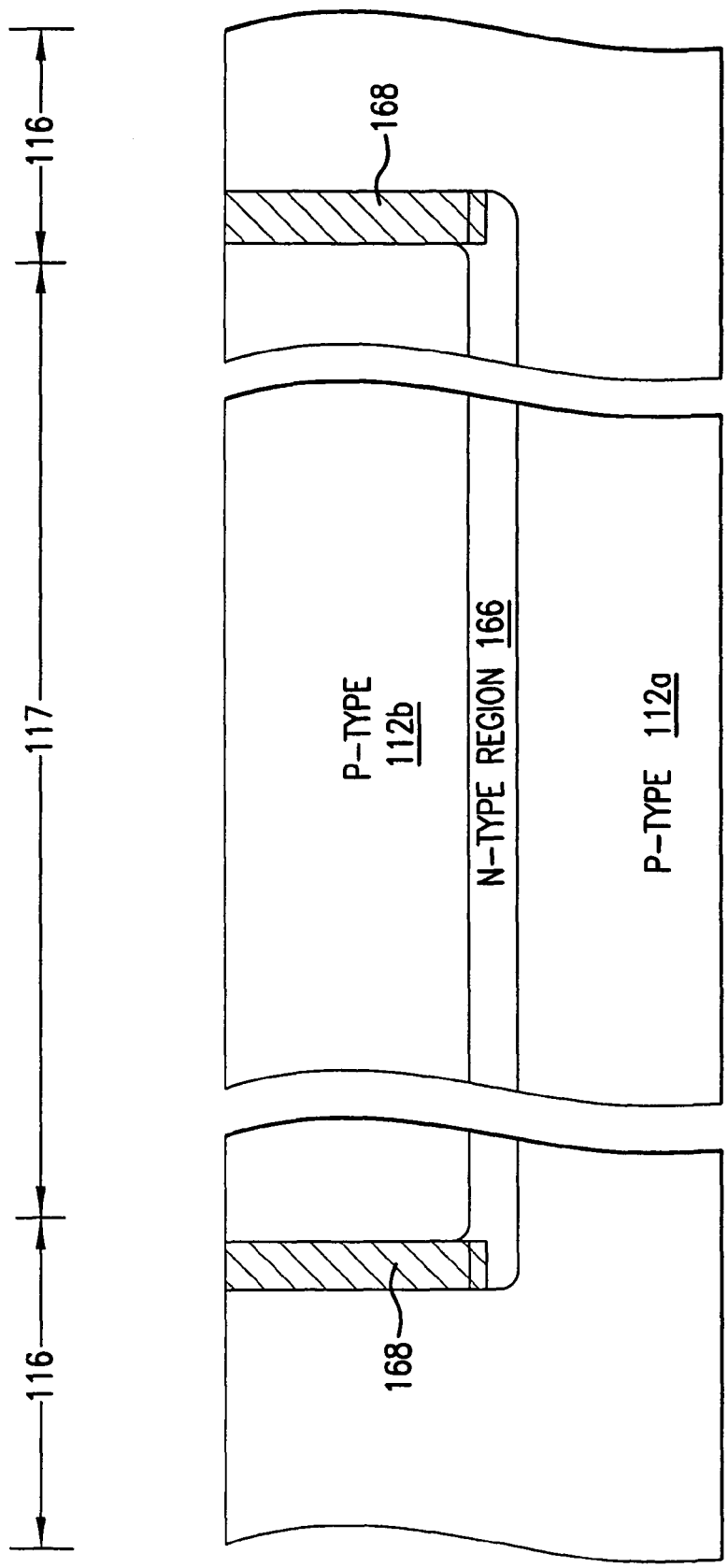
FIG. 3 is a view of the FIG. 1A sensor fragment at one processing step subsequent to that shown by FIG. 2.

Referring now to FIG. 3, a first conductivity type implant, for example p-type conductivity, is provided into the substrate to form a second p-type substrate area 112*b* and define a deep n-type region 166 having an n-type sidewall 168. The deep n-type region 166 is preferably sandwiched between the first p-type substrate area 112*a* and the second p-type substrate area 112*b*. The n-type sidewall 168 and n-type region 166 form an n-type region isolation structure which separates the pixel array region 117 from the peripheral circuit region 116.

Figure 4:
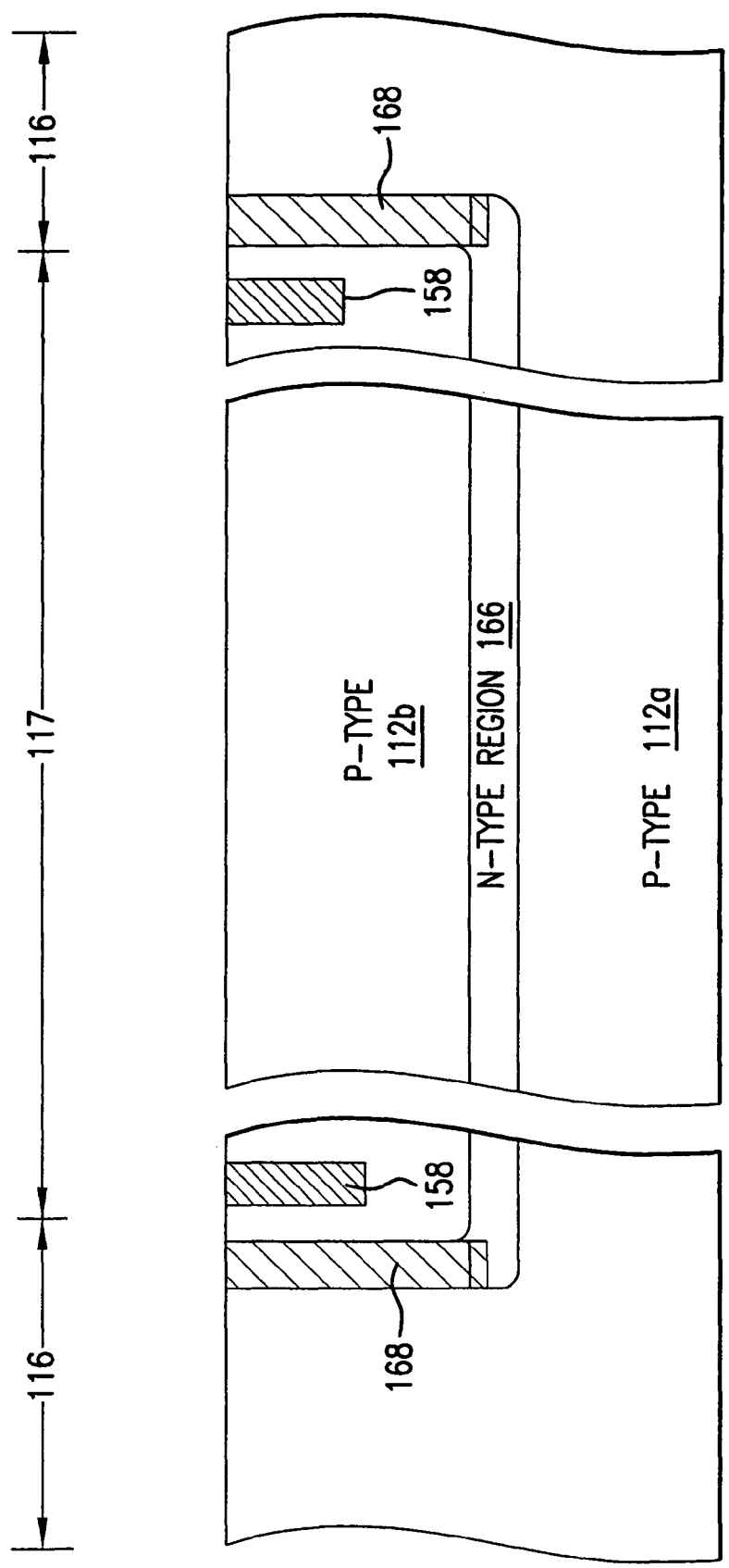
FIG. 4 is a view of the FIG. 1A sensor fragment at one processing step subsequent to that shown in FIG. 3.

Referring now to FIG. 4, a first conductivity type implant, for example p-type conductivity, is also provided to form a peripheral p-well wall 158 around the perimeter of the pixel array substrate region 117. The p-well wall 158 preferably extends to contact the second p-type substrate area 112*b*. The p-well wall 158 also is formed inward of the n-type sidewall 168. There may be instead, or also, p-well implants with each repeating pixel.

Figure 5:
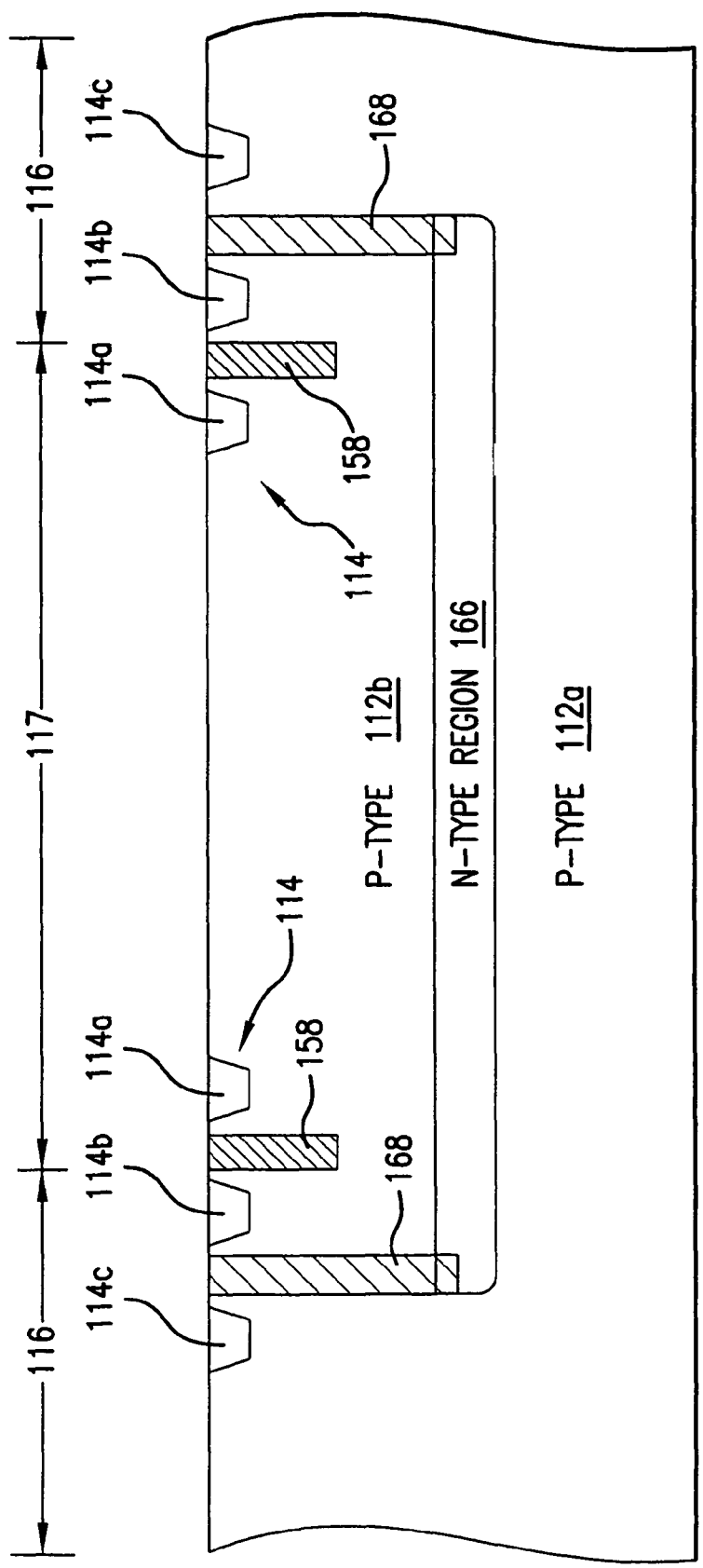
FIG. 5 is a view of the FIG. 1A sensor fragment at one processing step subsequent to that shown in FIG. 4.

FIG. 5 illustrates the next step in the process in which the field oxide regions 114 are formed throughout the image sensor 100. Field oxide regions are formed to reside in multiple areas of the image sensor 100. For example, the field oxide regions 114 are formed in association with the peripheral substrate region 116 and pixel array substrate region 117, and are shown such that field oxide region section 114a is provided to isolate pixels in the pixel array substrate region, field oxide region section 114b is provided between the p-well sidewall 158 and n-type sidewall 168, and field oxide region section 114b outward of the n-type sidewall in the peripheral substrate region 116. As indicated above, however, in a preferred embodiment of the fabrication process, the field oxide regions 114 can be formed first, i.e., before the n-type region 166, n-type sidewall 168, and p-well wall 158 are formed.

The field oxide regions 114 may be formed by any known technique such as by thermal oxidation of the underlying silicon in the Local Oxidation of Silicon (LOCOS) process or by etching trenches and filling them with oxide in a shallow trench isolation (STI) process and then planarizing them. The field oxide regions preferably do not extend to a depth greater than the depth of the n-type sidewall 168, and p-well wall 158. While the invention has been described as forming the n-type region 166, n-type sidewall 168, and p-well wall 158 before forming the pixels in the pixel array substrate region, for example, the gates, and photodiode diffusion regions, the invention is not so limited and the n-type region 166, n-type sidewall 168, and p-well wall 158 may be formed during or after formation of other structures of the pixels.

The deep n-type region 166 and corresponding n-type sidewall 168 serve to isolate the second p-type substrate area 112b from the first p-type substrate area 112a. The deep n-type region 166 and n-type sidewall 168 further serve to isolate transistors and circuitry in the pixel array substrate region 117 from peripheral circuits and transistors in the peripheral circuit region 116. As the peripheral circuit region is often a source of unwanted electrons, isolating the peripheral circuit region 116 from the pixel array substrate region prevents unwanted electrons from collecting in the pixel array substrate region 117, and in particular, in the photodiode regions 26. Thus, the n-type region 166 and n-type sidewall 168 form an electron collecting barrier surrounding the image sensor pixels formed in the pixel array substrate region 117.

A second embodiment of the invention is shown in FIGS. 6-9. The CMOS image sensor of the second embodiment is similar in structure to that of the first embodiment. In accordance with the second embodiment, instead of using a deep n-type region and an n-type sidewall to isolate the pixel array substrate region from a peripheral substrate region as described in the first embodiment, there is provided an n-type substrate having a p-type epitaxial layer 212 formed thereover, whereby an n-type sidewall 268 is used to isolate the pixel array substrate region 217 from peripheral substrate region 216.

Figure 6:
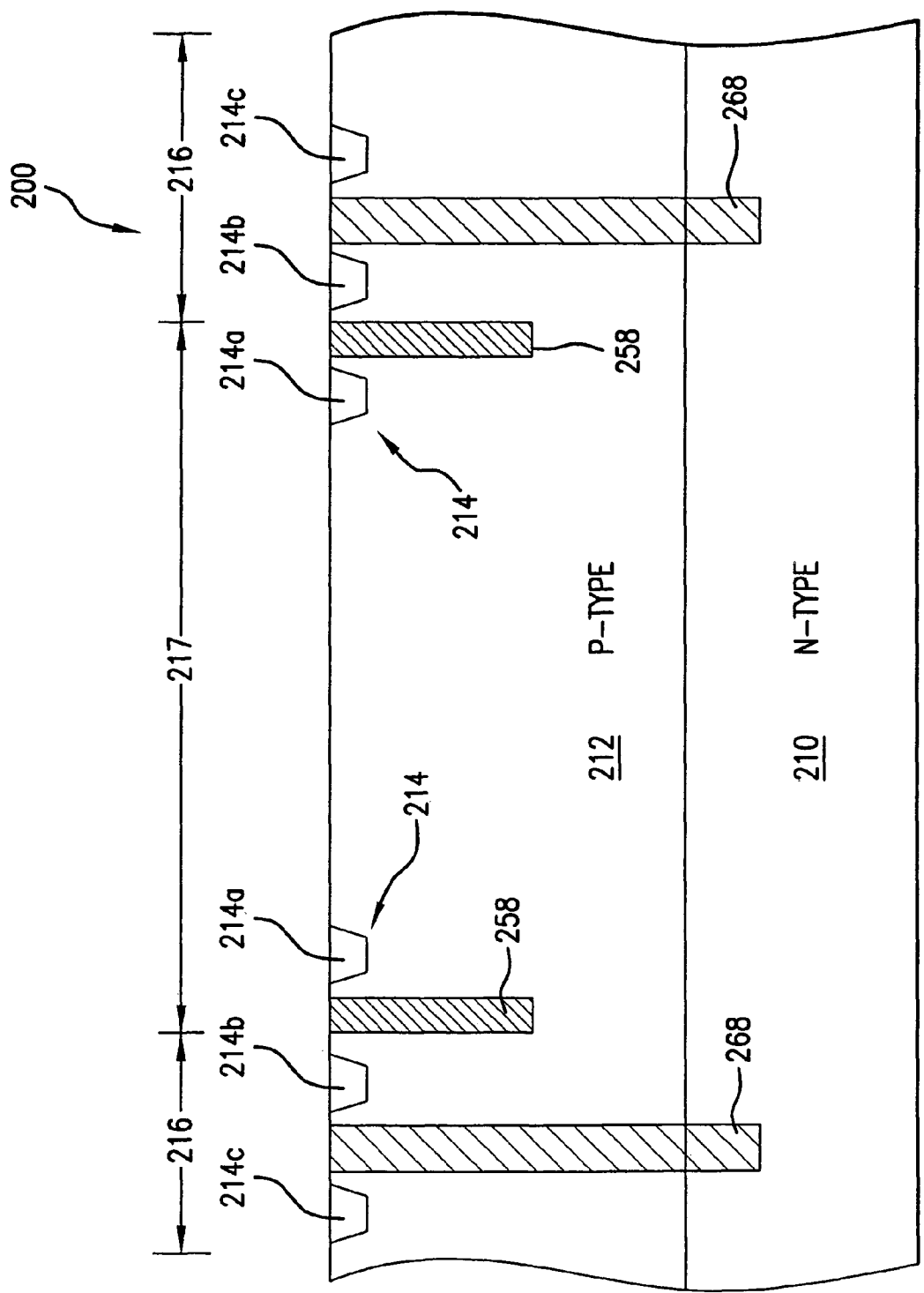
FIG. 6 is a fragmentary sectional view of a CMOS image sensor fragment in accordance with a second embodiment of the invention.

Referring now to FIG. 6, which illustrates a CMOS image sensor fragment in accordance with the second embodiment of the invention, indicated generally by reference numeral 200. Such comprises a p-type epitaxial or layer 212 formed over an n-type silicon substrate 210. It is also possible to implant the wafer with a p-type dopant and create p-type layer 212. The substrate includes a pixel array substrate region 217 and a peripheral circuit region 216. Field oxide regions 214 are provided in association with the peripheral substrate region 216 and pixel array substrate region 217. Although conductivity types are denoted in the description, for example, the substrate 210 is described as n-type and the epitaxial layer 212 is described as being p-type, these may be reversed and the invention is not limited to the arrangement of conductivity types as shown and described.

A peripheral n-type sidewall 268 is formed to extend through the epitaxial layer 212, and electrically contact the n-type substrate 210. The n-type sidewall 268 is preferably a contiguous structure that surrounds the pixel array substrate region 217.

A peripheral p-well wall 258 is also formed around the perimeter of the pixel array substrate region 217 and inward of the n-type sidewall 268. The p-well wall 258 is also formed within the p-type epitaxial layer 212. The p-well wall 258 provides an electrical connection to the second p-type epitaxial layer 212. The invention is not limited to one p-well wall 258 as shown, and any suitable number of p-well walls may be formed. The p-well wall 258 is preferably formed near the outer edges of the pixel array substrate region 217. It should be noted that the p-well wall 258 is preferably a contiguous structure, but that p-well wall 258 need not be contiguous.

Similarly as described above with respect to the first embodiment, although not shown for simplicity, multiple pixels for example, of the type shown in FIGS. 1A and 1B may be formed in the pixel array substrate region 217. Accordingly, the pixel array substrate region 217 includes one or more pixels having a photosensitive region, transistors and corresponding transistor gates formed inside the p-well wall 258.

Figure 7:
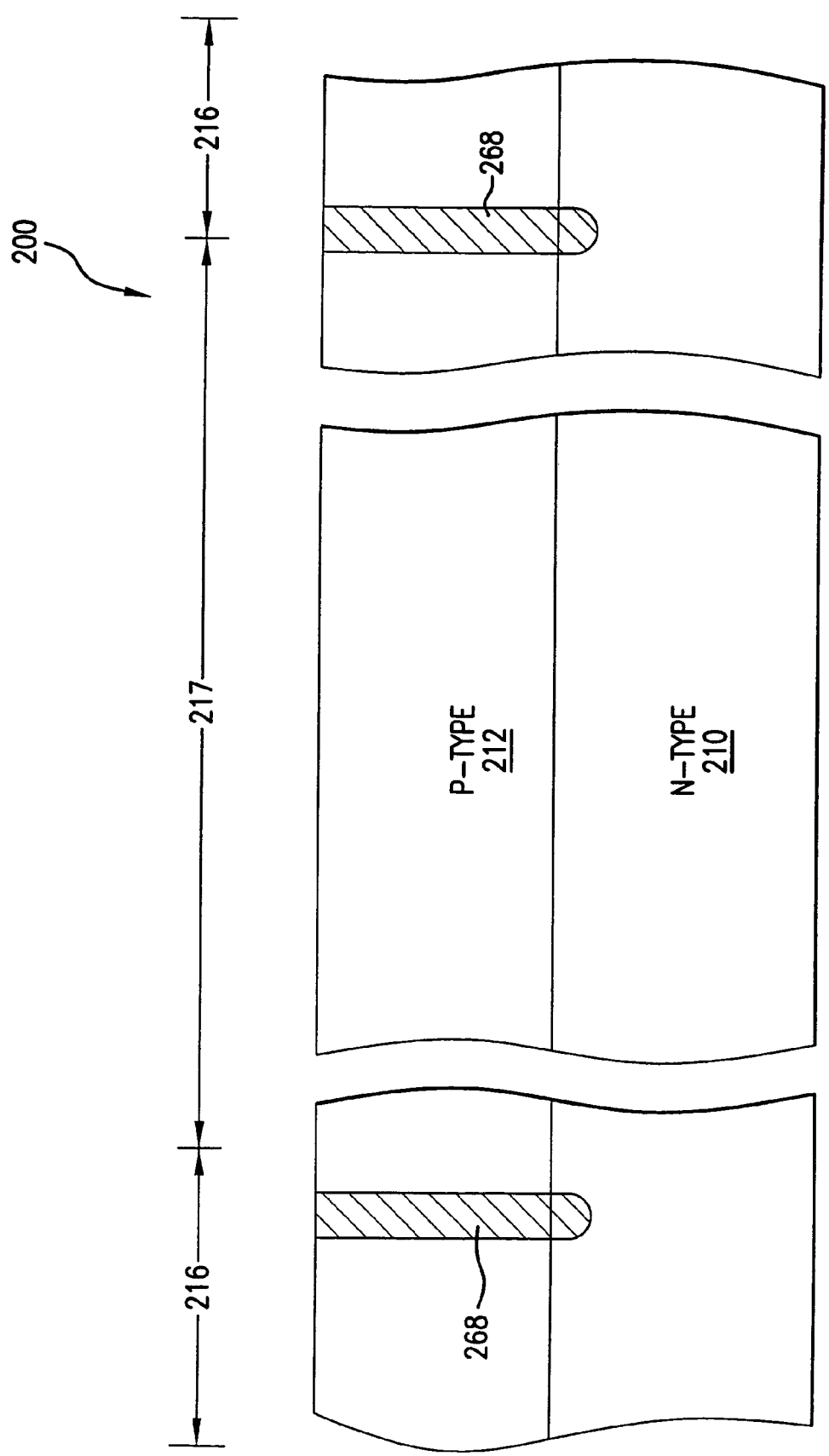
FIG. 7 is a view of the FIG. 6 sensor fragment at one processing step in accordance with the second embodiment of the invention.

The CMOS image sensor 200 in accordance with the second embodiment can be fabricated using various process techniques. One exemplary process is now described in connection with FIGS. 7 through 9. Referring now to FIG. 7, a first conductivity type substrate 210, for example n-type conductivity, is formed. A second conductivity type epitaxial or implanted layer 212, for example p-type conductivity, is formed over the n-type substrate 210. The substrate 210 includes a peripheral substrate region 216 and a pixel array substrate region 217.

A first conductivity type dopant, for example n-type, is provided into the substrate to form a peripheral n-type sidewall 268. The n-type sidewall 268 preferably is formed in and extends through the p-type epitaxial layer 212 to the n-type substrate 210 to be in electrical communication with the n-type substrate 210. The n-type sidewall 268 is preferably a contiguous structure. Rather than being contiguous around the pixel array it is more critical that the n-type collection regions be adjacent to any electron generating periphery circuits. The n-type sidewall 268 serves to isolate circuitry formed in the p-type epitaxial layer 212 of the pixel array substrate region 217 from circuitry in the p-type epitaxial layer 212 of the peripheral circuit region 216.

Figure 8:
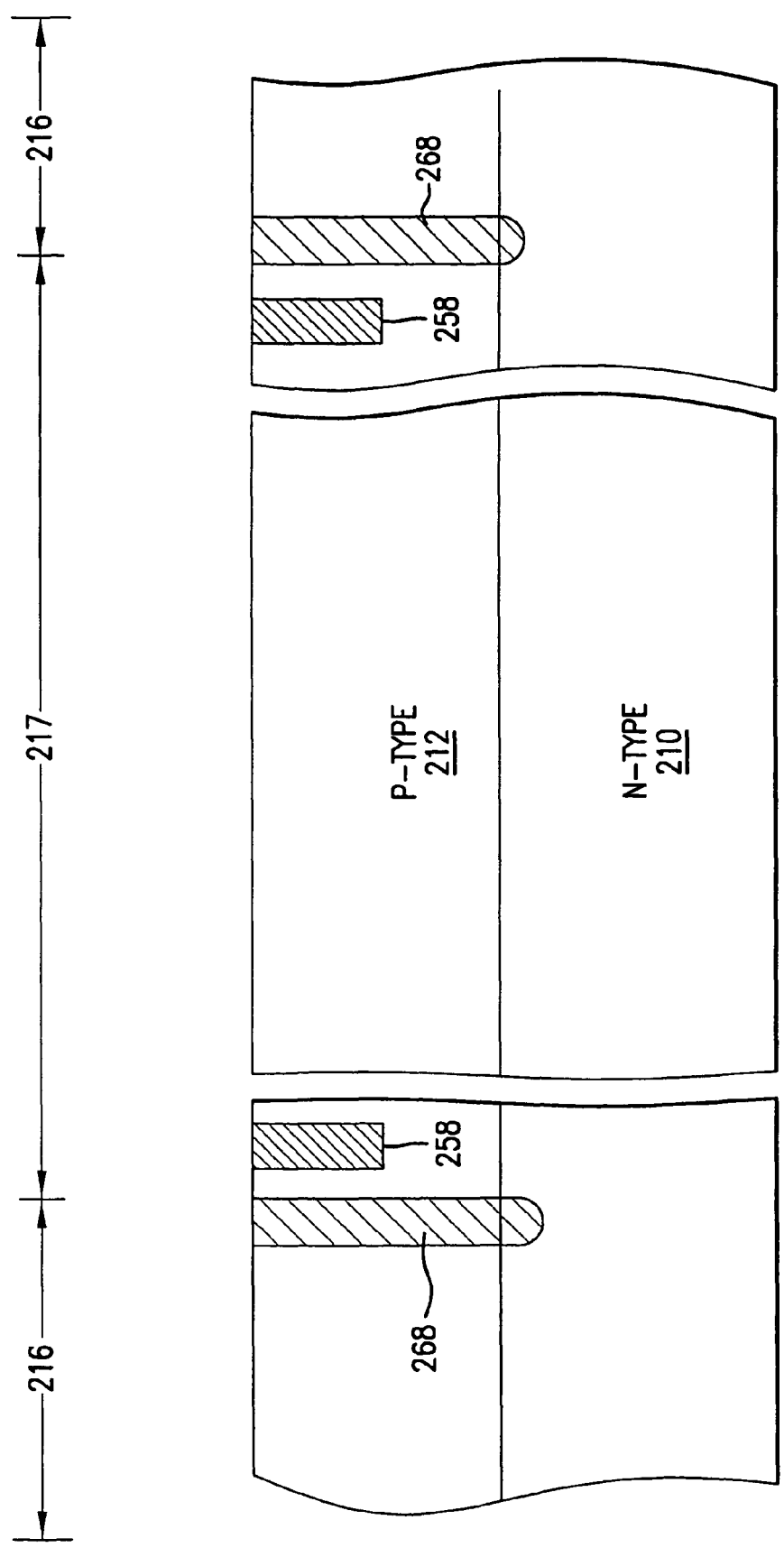
FIG. 8 is a view of the FIG. 6 sensor fragment at one processing step subsequent to that shown by FIG. 7.

Referring now to FIG. 8, a first conductivity type implant, for example p-type conductivity, is also provided to form a peripheral contiguous p-well wall 258 around the perimeter of the pixel array substrate region 217. The p-well wall 258 preferably extends to contact the p-type epitaxial layer 212. The p-well wall 258 also is preferably formed inwardly of the n-type sidewall 268.

Figure 9:
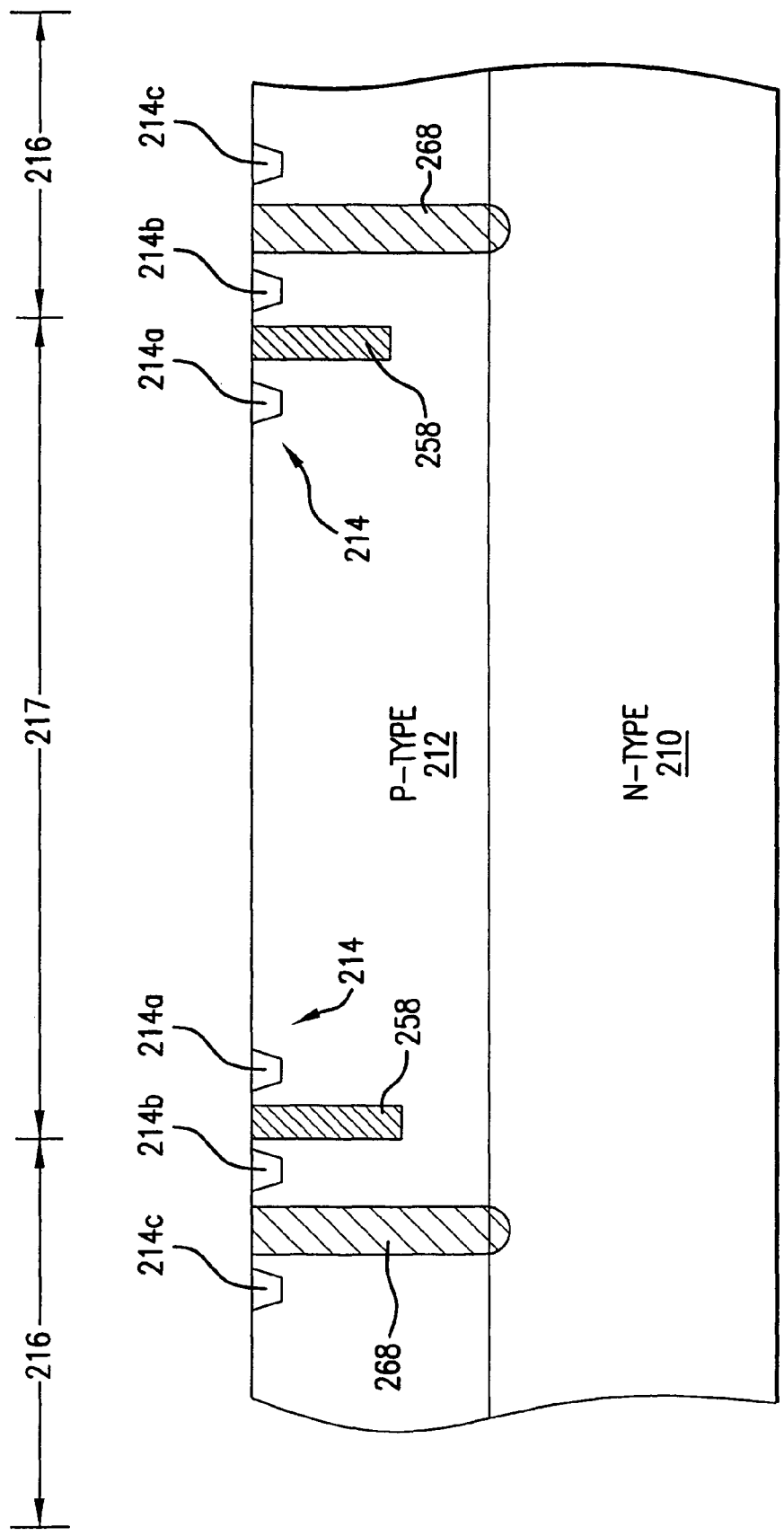
FIG. 9 is a view of the FIG. 6 sensor fragment at one processing step subsequent to that shown in FIG. 8.

FIG. 9 illustrates the next step in the process in which the field oxide regions 214 are formed throughout the image sensor 200 and within the p-type epitaxial layer 212. For example, the field oxide regions 214, are formed in association with the peripheral substrate region 216 and pixel array substrate region 217, and are shown such that a field oxide region section 214a is provided to represent field oxide regions which isolate pixels, field oxide region section 214b is provided to represent field oxide regions between the p-well sidewall 258 and the n-type sidewall 268, and field oxide region section 214c is provided to represent field oxide regions which are formed outward of the n-type sidewall 268 in the peripheral substrate region 216. As indicated above with respect to the first embodiment of the invention, however, in another embodiment of the fabrication process, the field oxide regions 114 are formed first, i.e., before the n-type region 166, n-type sidewall 168, and p-well wall 158 are formed.

The field oxide regions 214 are preferably formed to a depth less than the depth of the n-type sidewall 268 and p-well wall 258. The field oxide regions 214 may be formed by any known technique such as by thermal oxidation of the underlying silicon in a LOCOS process or by etching trenches and filling them with oxide in an STI process.

While the invention has been described as forming the n-type sidewall 268 and p-well wall 258 before forming the pixel circuitry, for example, before formation of the gates and photodiode diffusion regions, the invention is not so limited and the n-type sidewall 268, and p-well wall 258 may be formed during or after pixel circuit formation.

The n-type sidewall 268 serves to isolate the p-type epitaxial layer 212 in the pixel array substrate region 217 from the p-type epitaxial layer of the peripheral substrate region 216. Accordingly, the n-type sidewall 268 serves to isolate transistors and circuitry in the pixel array substrate region 217 from peripheral circuits and transistors in the peripheral circuit region 216. As the peripheral circuit region is often a source of unwanted electrons, isolating the peripheral circuit regions 216 from the pixel array substrate region 217 reduces unwanted electrons collecting in the pixel array substrate region 217, and in particular, in the photodiode active area 224. Thus, the n-type sidewall 268 forms an electron collecting barrier surrounding image sensor pixels formed in the pixel array substrate region 217.

As with the first embodiment, the FIG. 9 structure can then be further processed to form pixel circuits, for example, of the type shown in FIGS. 1A and 1B in the pixel array area 217. CMOS image sensors of the invention, and described with reference to FIGS. 1-9 and 12-15, may be further processed as known in the art to fabricate a CMOS image sensor.

A typical processor system, which includes a CMOS image sensor 442 having a sensor array formed in the manner described above according to the invention is illustrated generally in FIG. 10. The image sensor 442 provides an image signal produced from the pixels in the pixel array. The image from image sensor 442 can be further processed by the FIG. 10 system. A processor system is exemplary of a system having digital circuits, which could include the CMOS image sensor 442. Without being limiting, such a processor system could include a computer system, camera system, scanner, machine vision, vehicle navigation, video phone, surveillance system, auto focus system, star tracker system, motion detection system, image stabilization system and data compression system for high-definition television, all of which can utilize the invention.

A processor system, such as a computer system, for example generally comprises a central processing unit (CPU) 444, for example, a microprocessor, that communicates with an input/output (I/O) device 446 over a bus 452. The CMOS image sensor 442 also communicates with the system over bus 452. The computer system 400 also includes random access memory (RAM) 448, and, in the case of a computer system may include peripheral devices such as a flash memory card 454, or a compact disk (CD) ROM drive 456 which also communicate with CPU 444 over the bus 452. It may also be desirable to integrate the processor 444, CMOS image sensor 442 and memory 448 on a single IC chip.

It should be noted that although the invention has been described with specific reference to CMOS imaging circuits having a photodiode and a floating diffusion region, the invention has broader applicability and may be used in any imaging apparatus to isolate a pixel array from peripheral circuits. For example, the invention also applies to charge-coupled devices (CCD's), such as interline transfer (IT) CCD's. And, while the invention has been described with reference to n-channel devices, for p-channel array devices all of the implants can be of a switched type. Similarly, the processes described above are exemplary of many methods that could be used. The above description and drawings illustrate preferred embodiments which achieve the objects, features and advantages of the invention. It is not intended that the invention be limited to the illustrated embodiments. Any modification of the invention which comes within the spirit and scope of the following claims should be considered part of the invention.

The invention claim is:

1. A structure for isolating areas in a semiconductor device comprising:
    a substrate comprising a pixel array region and a peripheral circuit region, said pixel array region comprising a plurality of image sensor pixels;
    an n-type structure formed in said substrate, said n-type structure comprising: an n-type region, said n-type region being sandwiched between a first p-type region of said substrate and a second p-type region of said substrate and said n-type region extending at least beneath said pixel array region; and ann-type sidewall implant extending to and in electrical communication with said n-type region only outside of said pixel array region; wherein said n-type structure defines a p-type area situated in said pixel array region which is isolated from said peripheral circuit region; and
    at least one p-type implant for contacting said p-type area situated between said n-type sidewall implant and said pixel array region.

2. The structure of claim 1 wherein said sidewall is a contiguous structure.

3. The structure of claim 1 wherein said p-type implant is a contiguous wall implant.

* * * * *